United States Patent [19]

Schroeder et al.

[11] Patent Number: 5,210,493
[45] Date of Patent: May 11, 1993

[54] METHOD FOR EMBEDDING WIRES WITHIN A POWDER METAL CORE AND SENSOR ASSEMBLY PRODUCED BY SUCH A METHOD

[75] Inventors: Thaddeus Schroeder; Chi H. Leung, both of Rochester Hills; Bruno P. B. Lequesne, Troy, all of Mich.; Robert W. Ward, Anderson, Ind.

[73] Assignee: General Motors Corporation, Detroit, Mich.

[21] Appl. No.: 842,938

[22] Filed: Feb. 27, 1992

[51] Int. Cl.$^5$ .................. G01R 33/06; G01R 3/00; H01F 1/06; G01P 3/488
[52] U.S. Cl. ................................. 324/252; 29/595; 29/608; 148/101; 324/174; 324/207.21; 335/302
[58] Field of Search ............... 324/173, 174, 207.20, 324/207.21, 207.25, 251, 252; 335/296, 302, 303; 29/595, 607, 608; 148/101

[56] References Cited

U.S. PATENT DOCUMENTS

| | | | |
|---|---|---|---|
| 3,408,573 | 10/1968 | Wullkopf et al. | 335/303 X |
| 4,926,122 | 5/1990 | Schroeder et al. | 324/207.13 |
| 4,926,154 | 5/1990 | Heremans et al. | 338/32 R |
| 4,939,456 | 7/1990 | Morelli et al. | 324/207.21 |
| 4,978,938 | 12/1990 | Partin et al. | 338/32 R |

FOREIGN PATENT DOCUMENTS 0110122  6/1984  European Pat. Off. ............ 324/235

*Primary Examiner*—Gerard R. Strecker
*Attorney, Agent, or Firm*—Robert J. Wallace

[57] ABSTRACT

A semiconductor magnetoresistive sensor and a method for its assembly is specifically provided. The preferred assembly method of this invention is compatible with automated semiconductor chip placement and packaging technology, so as to alleviate the previous requirement that the semiconductor sensing element be separately packaged. The sensor leads are substantially embedded within a powdered metal permanent magnet body. An exposed terminal end of each lead is available for electrical and adhesive contact to a subsequently attached magnetoresistive semiconductor sensing element, using conventional semiconductor placement and packaging techniques. The powdered metal magnetic body is preferably formed by utilizing powder metal compaction techniques, wherein the powder metal is compacted around the interior electrical leads. The teachings of this invention may also be employed to form a variety of electrical sensors and devices, wherein the leads are substantially embedded within a metal core so as to produce a solid assembly. The embedded leads may have a variety of shapes, such as straight or coiled, may range in number from one to a plurality, and may have a variety of physical properties, such as magnetic or non-magnetic, depending on the desired application.

9 Claims, 2 Drawing Sheets

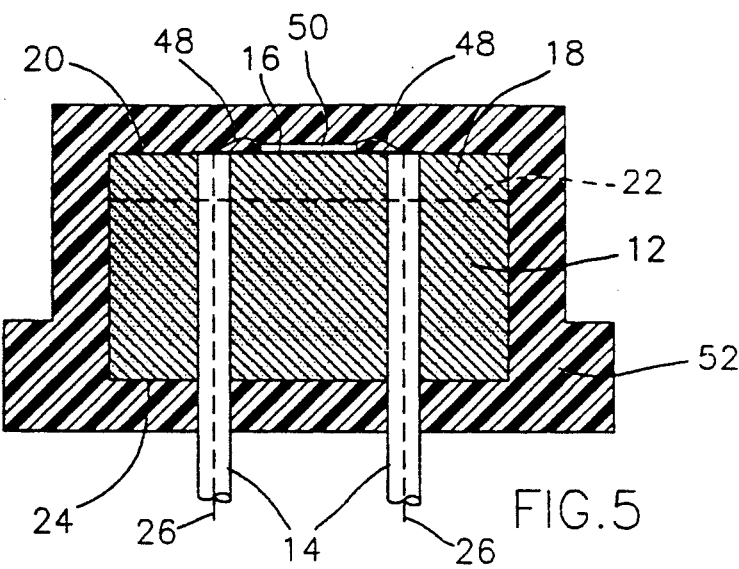
FIG. 5
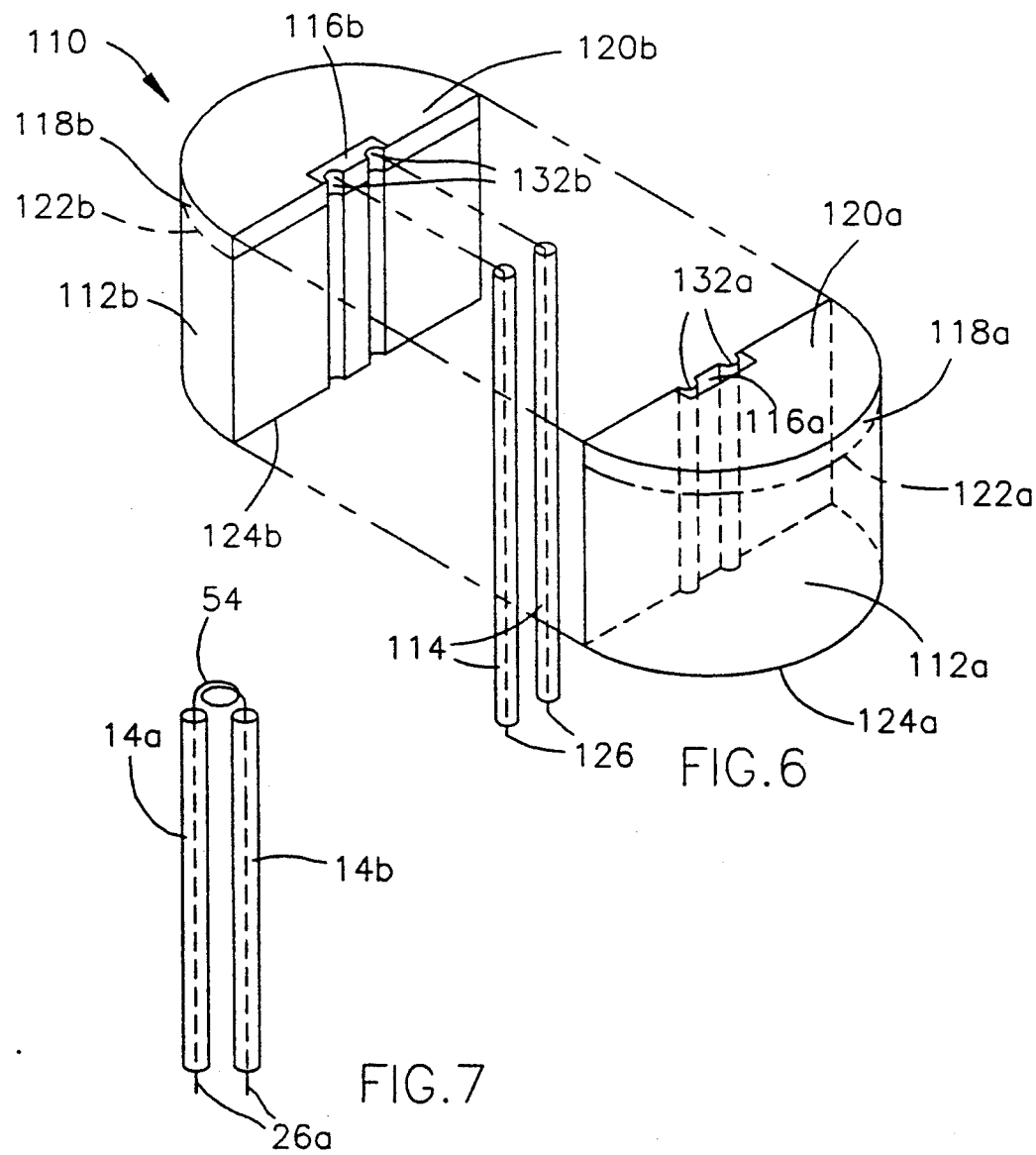
FIG. 6
FIG. 7

METHOD FOR EMBEDDING WIRES WITHIN A POWDER METAL CORE AND SENSOR ASSEMBLY PRODUCED BY SUCH A METHOD

FIELD OF THE INVENTION

The present invention generally relates to the manufacturing of sensors and other assemblies wherein electric wire structures are embedded within a powder metal core to form a solid assembly, and wherein such an assembly is compatible with semiconductor and other electrical device processing equipment. More particularly, this invention relates to the manufacturing of a magnetoresistive position sensor having its electrical wire structures embedded within a powder metal permanent magnet body, whereby such a sensor senses changes in magnetic flux passing through a magnetic flux sensitive element.

BACKGROUND OF THE INVENTION

The requirement for sensing position, speed or acceleration is growing, particularly in the automotive field. Anti-lock braking systems, traction control systems, electric power steering, four-wheel steering and throttle control are all examples of functions that can use such sensing means.

For such applications, it is desirable to have a position sensor, wherein speed and acceleration may be derived from a position signal. Such a sensor should be rugged and reliable, small and inexpensive, capable of low (including zero) speed sensing and relatively immune to noise, such as electromagnetic field interference, from the other systems used in an automobile.

A commonly known type of position sensor is a semiconductor magnetoresistive sensor. Such a sensor comprises a magnetic circuit that includes two basic parts. One of these parts, typically kept stationary, includes a semiconductive sensing element that is sensitive to the level of magnetic flux density passing through its surface. This stationary element further includes a permanent magnet for creating a bias flux. The other of the two parts, commonly referred to as the exciter, includes a high magnetic permeability element with a series of teeth that moves with relation to the stationary element. As the teeth move past the stationary element, the reluctance of the magnetic circuit and the magnetic flux density through the sensing element vary continually, corresponding to the relative position of the teeth.

An illustrative example of such a semiconductor magnetoresistive sensor is taught in U.S. Pat. No. 4,926,122 to Schroeder et al. entitled, "High Sensitivity Magnetic Circuit," issued May 15, 1990 and assigned to the same assignee of the present patent application. The Schroeder sensor features a simple, planar geometry that makes it amenable for batch processing at a relatively low cost, while still providing sensitivities which are appreciably higher than the prior art structures. The Schroeder sensor more than satisfactorily meets the objectives of such a sensor.

However, as the use of these semiconductor magnetic position and speed sensors is increased, it would be desirable to further reduce the cost of the sensor, so as to make it even more attractive for automotive use. As with many other types of semiconductor devices, the cost of packaging the magnetic semiconductor chip into a magnetic position sensor generally exceeds the cost of the semiconductor chip itself, often by a factor of many times. Accordingly, it would appear that a substantial cost saving could be realized by the use of a lower cost package.

For the sensor performance in this type of magnetoresistive sensor which contains a small permanent magnet in addition to the semiconductor chip, the semiconductor chip should be attached directly to the surface of the permanent magnet. Currently, in order to accomplish this, the packaging process involves both macroelectronic assembly techniques for construction of the sensor body housing the permanent magnet, and microelectronic assembly techniques for attachment of the semiconductor chip. Generally, these two assembly techniques are relatively incompatible because of the extreme difference in dimensions for each of the operations and, therefore, cannot be performed concurrently. Thus, the sensor manufacturers typically employ a two-step packaging process. First, the semiconductor chip is packaged as a semiconductor device using microelectronic packaging technology. Then, the package device is repackaged by the sensor manufacturer into the resultant sensor for the particular application.

A significant shortcoming associated with this current packaging approach is that it suffers from too many steps and components. In addition, the thickness of the packaged semiconductor sensing element is significantly larger than that of the active components within the sensor. This is disadvantageous in that the thickness of the sensing element requires that the permanent magnet be positioned farther from the toothed exciter wheel, and the farther apart the permanent magnet and the exciter wheel, the weaker the magnetic field in the air-gap therebetween. Thus, the sensitivity of the sensor is diminished. Also, because of the unnecessarily large size of the packaged semiconductor element, intricate sensor geometries which would make high resolution and/or miniature applications possible cannot be considered.

Therefore, it would be desirable to utilize semiconductor chip packaging technology, which is highly accurate and automated, for the production of these and other types of sensors. The use of semiconductor packaging techniques would result in a package of reduced size, and probably also reduced cost, as compared to conventional techniques for manufacturing these types of sensors. In order to utilize semiconductor packaging techniques, the permanent magnet and the sensor terminals should be provided in a form which is compatible with the placement and bonding equipment used to attach the semiconductor sensing element to the sensor body.

SUMMARY OF THE INVENTION

It is, therefore, an object of this invention to provide a method for assembly and packaging of electrical sensor wherein the sensor leads are substantially embedded within a body of powder metal, and wherein the body of powder metal is compatible with automated semiconductor chip packaging techniques, if so desired.

It is a further object of this invention to provide a semiconductor magnetoresistive sensor and method for its assembly and packaging, wherein the sensor leads are substantially embedded within a magnetic body yet also available for electrical contact with a subsequently attached semiconductor magnetoresistive sensing element.

It is still a further object of this invention that such a method for assembly of the substantially embedded leads utilize powder metal compaction techniques, so as to produce a body which is compatible with semiconductor placement and packaging techniques.

In accordance with a preferred embodiment of this invention, these and other objects and advantages are accomplished as follows.

According to the present invention, there is provided a semiconductor magnetoresistive sensor and a method for its assembly. The preferred assembly method of this invention is compatible with automated semiconductor chip placement and packaging technology, so as to alleviate the previous requirement that the semiconductor sensing element be separately packaged.

For assembly of the magnetoresistive sensor, the sensor leads are substantially embedded within a powdered metal permanent magnet body. An exposed region of the terminals is available for electrical contact to a subsequently attached magnetoresistive semiconductor sensing element, which would be attached using conventional semiconductor placement and packaging techniques. The powdered metal magnetic body is preferably formed by utilizing powder metal compaction techniques, wherein the powder metal is compacted around the interior electrical leads.

More specifically, the semiconductor magnetoresistive sensor contains a permanent magnet, a ferromagnetic layer and embedded electrical leads, which are electrically insulated from the permanent magnet body. These components are all assembled in a single operation of press forming. The ends of the electrical terminals are precisely located at a first surface of the magnet body, so that they can be contacted by the semiconductor bonding equipment which is subsequently employed for electrical connection with the magnetoresistive semiconductor sensing element. After attachment of the semiconductor element, the molded assembly is then overmolded with an appropriate coating so as to form the desired external sensor shape.

Particularly advantageous features of this invention include the elimination of the requirement that the semiconductor sensing element be separately packaged and then attached (as a package) to the permanent magnet body. A further advantage includes only a single press forming operation for assembly of the magnetic body having the embedded electrical leads. In addition, the magnetic body is connected directly to the sensing element, rather than a relatively large and bulky conventional lead frame. Further, the semiconductor sensing element can be electrically and adhesively connected to the terminals using conventional semiconductor placement and processing techniques, including wire bonding or conductive epoxy technologies which are highly automated and precise.

Lastly, also provided by the teachings of this invention is a broader method for assembly of a variety of electrical sensors, wherein the leads are substantially embedded within a metal core so as to produce a solid assembly. The embedded leads may have a variety of shapes such as straight or appropriately coiled, may range in number from one to a plurality, and may have a variety of physical properties such as magnetic or non-magnetic, depending on the desired application.

Other objects and advantages of this invention will be better appreciated from the following detailed description.

BRIEF DESCRIPTION OF THE DRAWINGS

Reference will be made to the accompanying drawing wherein:

FIG. 5 cross-sectionally illustrates a finished assembly in accordance with this invention, wherein a sensing element is electrically connected to the embedded leads within the powder metal body, and then the entire assembly overmolded to form the desired sensor shape;

FIG. 6 is an exploded view illustrating an alternative manufacturing method for forming the assembly of FIG. 1; and FIG. 7 illustrates one of the possible alternative lead configurations which could be employed with the teachings of this invention.

DETAILED DESCRIPTION OF THE INVENTION

A semiconductor magnetoresistive sensor and method for its assembly and packaging are provided. Also provided by the broader teachings of this invention is a method of assembly of a variety of electrical sensors, wherein the leads are substantially embedded within a metal core so as to produce a solid assembly. The sensors may be useful in a variety of applications, as described more fully later.

Figure 1:
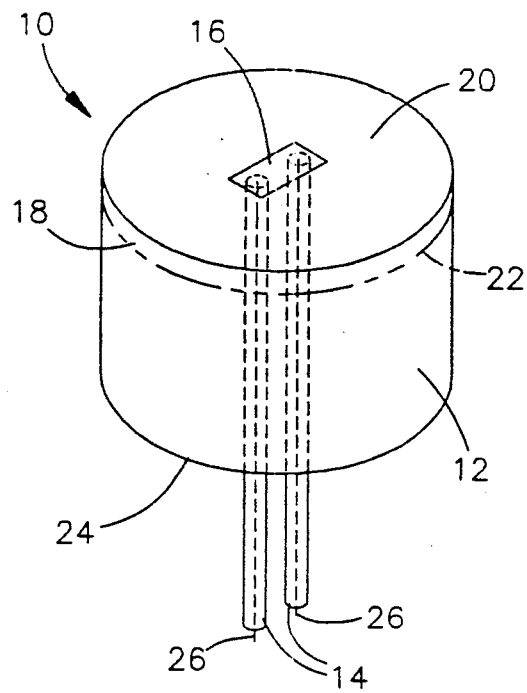
FIG. 1 illustrates an assembly formed in accordance with this invention, wherein two leads are embedded within a powdered metal body; specifically, a magnetic body for use in a magnetoresistive sensor.

As shown in FIG. 1, a subassembly 10 suitable for use within a semiconductor magnetoresistive sensor is provided by the method of this invention. The subassembly 10 preferably contains a permanent magnet body 12 for generating the magnetic flux, a ferromagnetic layer 18 for concentrating the flux, and electrically insulated leads 14 which are embedded within the permanent magnet body 12 and ferromagnetic layer 18.

The permanent magnet body 12 is preferably formed from neodymium-iron-boron permanent magnet material, commercially available from General Motors Corporation under the tradename "Magnequench," and specified more fully in U.S. Pat. No. 4,802,931 to Croat issued Feb. 7, 1989. Specific compositions which have been useful in preparing permanent magnets of this type, in weight percentages, are as follows and contain the magnetic phase consisting of $Fe_{14}Nd_2B$ (or the equivalent) tetragonal crystals; about 26 to 32 percent rare earth (wherein at least about 95 percent of this constituent is neodymium and the remainder is essentially praseodymium); about 0.7 to about 1.1 percent boron; about 0.1 to about 0.15 percent carbon or tantalum; and the balance being iron with cobalt being substituted for the iron in some instances from about 2 to about 16 percent. In addition, gallium may also be added in an amount of between about 0.55 and 0.75 percent.

This permanent magnet neodymium-iron-boron material is preferred for formation of the permanent magnet body 12 because of the material's high intrinsic magnetic coercivity. It is foreseeable that other permanent magnet materials could also be used if desired.

The ferromagnetic layer 18 is optional, but preferred, for use in a semiconductor magnetoresistive sensor, as taught in the above-identified U.S. patent to Schroeder et al. The ferromagnetic layer 18 provides a high magnetic permeability region which makes it easier for the magnetic flux within the permanent magnet body 12 to travel toward or away from a sensing element (not shown in FIG. 1, but subsequently attached to wires 26 at region 16), thus increasing the maximum flux and decreasing the minimum flux that passes through the sensing element. This thereby increases the sensitivity of such semiconductor magnetoresistive sensors. This sensitivity-improving layer 18 is preferably formed from iron for practical reasons; however, any soft magnetic material may be employed. The optimum size of this ferromagnetic layer 18 is dependent on the size of the permanent magnet body 12; however, ferromagnetic layers (18) as thin as about 0.01 inch may be satisfactorily used and, in fact, this thickness represents the lower limit useful for reliable processing of the ferromagnetic layer 18. Depending on the particular application envisioned, the thickness of this ferromagnetic layer 18 may vary greatly. In addition, it is foreseeable that a ferromagnetic body could be alternatively employed on the back of the permanent magnet body 12, so as to provide a partial return path for the flux; presumably, this ferromagnetic body would be substantially thicker.

Figure 2:
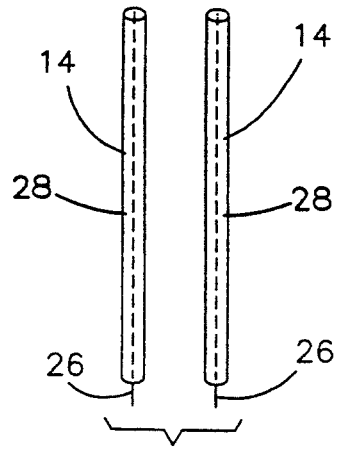
FIG. 2 illustrates the insulator coated leads embedded within the powdered metal body of FIG. 1.

As shown more closely in FIG. 2, the insulated electrical leads (reference numeral 14 in FIG. 1) each consists of a conventional electrically conductive wire 26 which has been coated, or wrapped, with an appropriate electrically insulative material 28, such as a suitable plastic, or possibly a high temperature refractory, such as glass, or any suitable silicate or aluminate. The electrically conductive wires 26 must be insulated so as to prevent inadvertent electrical shorting of the sensor signal between the wires 26 and the permanent magnet body 12 and/or ferromagnetic layer 18. The insulative material 28 used to insulate the wires 26 must also be sufficiently strong so as to be capable of tolerating the subsequent compaction operations employed to form the subassembly 10, yet sufficiently yielding to tolerate the various thermal coefficients of expansion associated with the wire (26) material, the permanent magnet material (12) and the ferromagnetic material (18). It is also preferred that the embedded leads 14 be non-magnetic, so as to avoid detrimental influence on the magnetic flux density within the permanent magnet body 12.

Referring again to FIG. 1, an advantageous feature of this invention is that the embedded leads 14 within the subassembly 10 are positioned within the subassembly 10 so that a first end of the leads 14 terminate at a bonding region 16 provided on the top surface 20 of the subassembly 10. During subsequent processing, the preferred sensing integrated circuit, such as the magnetoresistive sensor, is electrically and adhesively connected to the wires 26 at the bonding region 16. Generally, the bonding region 16 represents the predetermined location where the sensing element will be subsequently attached, as discussed more fully later. It is foreseeable that a layer of an appropriate adhesive could be deposited onto the bonding region 16 so as to ensure a rigid attachment; or, alternatively, a thermally conductive adhesive could be used to enhance the movement of heat away from the sensor to the heat sinking permanent magnet body 12.

With this invention, the integrated subassembly 10 containing the embedded leads 14 within the permanent magnet body 12 and ferromagnetic layer 18 replaces the conventional type of lead frame used for placement and connection with the semiconductor element. This is another significant advantage of this invention in that the number of components and processing steps are accordingly minimized by the elimination of a conventional lead frame which would have had to be incorporated into the permanent magnet body 12.

It is to be noted that although two leads 14 are shown, their number may vary depending on the desired application, such as the magnetic semiconductor element and/or sensor configuration employed. In addition, a third grounding lead could also be provided, if desired. The embedded leads 14 may also be formed so that their connecting end at bonding region 16 is enlarged, similar to the shape of a nail head, thereby increasing the bonding area available for connection between the wires 26 and sensing element. Other alternative configurations are also possible with this invention, as discussed later.

Again referring to FIG. 1, the embedded leads 14 are disposed within the subassembly 10 so that the opposite end of the leads 14 extend from the bottom surface 24 of the permanent magnet body 12. The leads 14 are then capable of being conventionally connected to other electronic devices (not shown), or a power source if desired. In addition, the extended end of the leads 14 may be specifically shaped so as to allow direct mounting on a printed circuit board or other structure, if desired.

The permanent magnet body 12, ferromagnetic layer 18, and embedded leads 14 are assembled concurrently to form the subassembly 10 in a single press forming or compaction operation. This is accomplished by preferably using powdered metal forms of the neodymium-iron-boron and ferromagnetic materials, and appropriately compacting, as illustrated in FIGS. 3 and 4.

Figure 3:
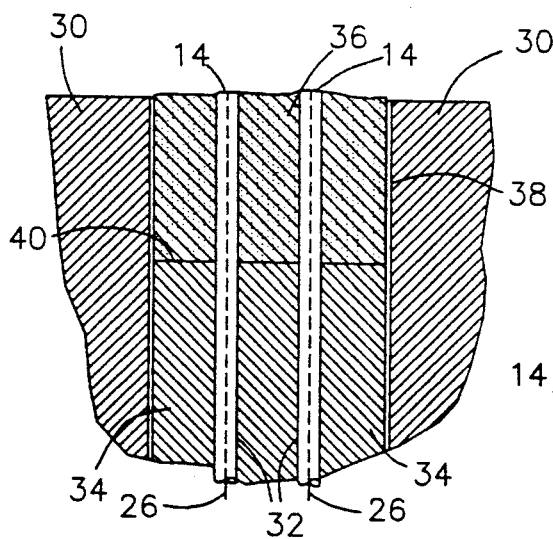
FIGS. 3 and 4 cross-sectionally illustrate the preferred manufacturing steps wherein the powdered metal body of FIG. 1 is formed by compacting the powder metal around the embedded leads.

As shown in FIG. 3, a molding die 30 of the desired dimension and having an inner cavity 38 is filled with the appropriate powdered metal particles. A bottom punch 34 defines the bottom surface 40, and the inner cavity 38 of the molding die 30 defines the walls of the cavity into which the powdered metal particles 36 are poured. The bottom punch 34 has predetermined longitudinal cylindrical regions 32 for insertion of the insulated coated wires 14. In practice, the insulated coated wires 14 would most probably be inserted within the longitudinal regions 32 in the bottom punch 34 before the powdered metal particles 36 are introduced into the molding die 30. This ensures their accurate placement within the molding die 30.

In FIG. 3, the powdered metal particles 36 are shown in filling the molding die 30 completely. The molding die 30 may be filled by the powdered metal particles 36 to any height, depending on the desired density and configuration being produced. Also, the powdered metal particles 36 may consist of only the permanent magnet material or may be a combination of materials, such as mostly the permanent magnet material with a lesser amount of ferromagnetic material provided near the top of the molding die 30, as would be the case in the preferred subassembly 10 for use in the magnetoresistive sensor.

Figure 4:
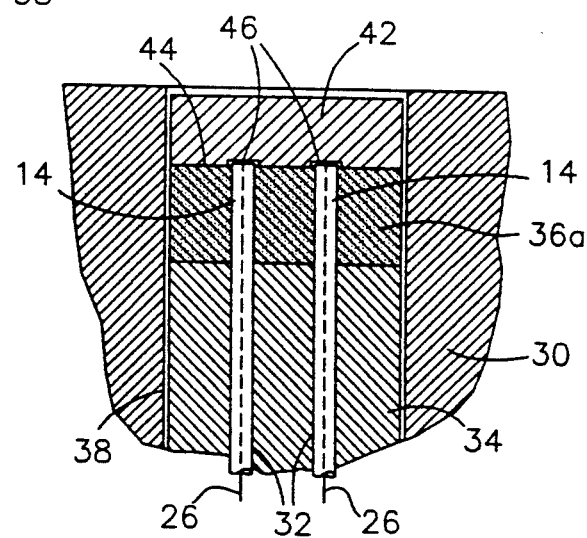

Next, for formation of the subassembly 10 having the permanent magnet body 12 and embedded leads 14, as shown in FIG. 4, a top punch 42 is introduced within the molding die 30. The top punch 42 compacts the powdered metal particles (36) to form the compacted powdered metal body 36a. Compaction occurs at a temperature and pressure sufficient to yield a compacted powdered metal body 36a of desired density and strength.

As shown in FIG. 4, shallow recesses 46 for the wires are provided within the top punch 42. The embedded leads 14 are purposely positioned within the powdered metal body 36a so that their terminal ends are coplanar with the top surface 44 of the powdered metal body 36a, for subsequent electrical contact with a sensing element. The recesses 46 protect the leads 14 from being covered with the compacted powder metal. The height of each recess 46 is shown exaggerated to better illustrate the method of this invention; however, it need only be a few microns in height, just sufficient to protect the terminals of the leads 14 from being covered by compacted material.

The compacted powder metal body 36a may be formed by press forming, as illustrated, or, alternatively, by plastic molding techniques, such as injection molding, of the powdered metal within the mold around the leads 14. Other means for forming a dense powder metal body 36a could also foreseeably be employed. In addition, as in the preferred embodiment wherein two powder metal materials are employed, low density pre-compaction of the first (permanent magnet) material may occur, followed by additional filling of the molding die 30 with the second (ferromagnetic) material, and further compaction of the second material to form the fully dense powder metal body 36a.

Referring again to the subassembly 10 of FIG. 1, after compaction, the powder metal body (36a of FIG. 4), consisting of essentially the permanent magnet body 12 and ferromagnetic layer 18, is preferably coated with a thin protective coating of epoxy on all surfaces, so as to prevent movement of any loose powders which could contaminate the semiconductor processing equipment, as well as to provide some oxidation protection. Although this step is preferred, it is not absolutely necessary. It is noted that an interface region 22 between the ferromagnetic layer 18 and the permanent magnet body 12 exists after compaction.

As shown in FIG. 5, the subassembly 10 is then further processed so as to form a final sensor, such as a semiconductor magnetoresistive sensor. The terminal ends of the embedded electrical leads 14 are precisely located at the top surface 20 of the body. The embedded leads 14 electrically contact a semiconductor sensing element 50, such as the preferred magnetoresistive sensing element. It is to be noted that the dimensions of the components within FIG. 5 are exaggerated as compared to the sensing element 50 so as to best describe the teachings of this invention.

Another particularly advantageous feature of this invention is that the design of the permanent magnet subassembly permits the use of conventional semiconductor placement and bonding equipment for attachment of the semiconductor sensing element 50 to the bonding region 16. The electrical connection (represented by wire bonds 48) between the semiconductor sensing element 50 and the electrically conductive wires 26 within the embedded leads 14 is achieved using conventional connection techniques, i.e., preferably wire bonding methods. After attachment of the semiconductor magnetoresistive sensing element 50, the assembly is then overmolded with an appropriate protective coating 52, such as suitable thermoset phenolics or thermoplastic nylons, so as to form the desired external sensor shape. The exterior molded shape 52 may vary greatly depending on the intended application.

The preferred assembly method of this invention for formation of the compacted powder metal permanent magnet body 12 having the embedded leads 14 is compatible with automated semiconductor chip placement and packaging technology. This alleviates the previous requirement which dictated separate packaging of the semiconductor sensing element 50.

In a specific example, neodymium-iron-boron magnet powder known commercially as Magnequench and magnetically soft elemental iron powder were utilized for the fabrication of the permanent magnet 12 and ferromagnetic layer 18, respectively. The apparent density of the permanent magnet powder was about 2.12 grams per cubic centimeter (g/cc), and the apparent density of the iron powder was about 2.2 g/cc. Both of these metal powders were pretreated so that the individual particles were encapsulated with an appropriate thermoplastic material. Other polymers such as a thermosetting plastic or other suitable polymer and/or binder materials could also be employed.

The polymer coating is preferred so as to prevent corrosion of the metal powders, yet it also enhances the adhesion between the individual powder particles during compaction. In addition, the polymer coating prevents electrical communication between the magnetic particles and the leads 14 and also, if necessary, between the individual magnetic particles within the powder metal body.

Preferably, for the encapsulation of the powders, the thermoplastic material is mixed with a liquid solvent and then sprayed onto the individual powdered particles. To facilitate this process, a source of heated air directs powder particles upward through a vertical tube (not shown) in which the spraying occurs. The coated particles fall outside the tube and thereafter are directed back to an inlet of the tube. After a number of passes through the tube, the particles are all coated to a desired extent. In the course of this process, the solvent evaporates and may be recovered by known methods.

The highest magnetic properties for the neodymium-iron-boron permanent magnet powder and the iron powder can be achieved by compacting at as great a pressure as possible, such as about 50 tons per square inch, and at a temperature of between about 300° F. to 600° F., so as to achieve a magnet body 12 density greater than about 5.8 grams/centimeter$^3$ and an iron layer 18 density greater than about 7.0 grams/centimeter$^3$. In addition, the compacting temperature employed may be as low as about 150° F. with this particular powder and coating with acceptable results obtained.

Each of the embedded leads 14 consisted of an individual copper wire 26, about 0.5 millimeter in diameter. The copper wire 26 was coated (reference numeral 28 in FIG. 2) with a high temperature, electrically insulative, epoxy resin commercially available as Scotchcast Brand Electrical resin 5230. The coating (28) was about 0.1 millimeter in thickness, and was suitable for the process temperature and pressure employed. Practically, the coating (28) could foreseeably range in thickness from about 0.01 millimeter to about 0.3 millimeter. Too thin a coating (28) may allow penetration (and possible electrical shorting) by the magnetic particles, and too thick a coating (28) may be impractical for handling and processing of the leads 14. In addition, a low temperature vinyl coating, which is often used to coat electrically conductive wires, may soften excessively at the processing temperatures, therefore also allowing penetration by the magnetic particles and possible inadvertent electrical shorting.

Although the specific embodiment of this invention involves a magnetoresistive sensor wherein the permanent magnet body and ferromagnetic layer consist of polymer coated particles, and the leads which are embedded within the magnet body are also insulated, other alternative embodiments are foreseeable. In particular, the polymer coated metal particles could be utilized without coating the embedded leads, i.e., bare leads would be embedded within the powder metal body. Alternatively, if powder metals were utilized which were not individually encapsulated with a polymer, then higher magnetic properties for the magnetic body would result, but the embedded wires would still require an insulative coating. A particularly advantageous feature of this invention is that the teachings lend themselves to the formation of many useful embodiments.

Referring again to the specific embodiment, and particularly FIGS. 3 and 4, the powder metal dies used for compaction of the powder metal body 36a included a steel molding die 30 of about 12.8 millimeters inner diameter, a steel bottom punch 34 having two small holes 32 of about one millimeter diameter for feeding of the two insulator-coated leads 14, and a steel top punch 42.

Specifically, the insulated-coated leads 14 were fed through the two holes 32 within the bottom die so as to protrude from the top surface 40 of the bottom die by about two centimeters. Next, approximately 3.65 grams of the encapsulated permanent magnet neodymium-iron-boron powder particles were added into the molding die 30 and substantially levelled. Approximately 0.36 grams of the encapsulated iron powder particles was added on top of the permanent magnet powder particles within the molding die 30.

The molding die 30 was heated to a temperature of about 185° C. by means of an electric heater. The top punch 42 was introduced into the molding die 30, and a pressure of about 50 tons per square inch was applied to the powder metal particles and held for about five seconds. The top punch 42 was then removed and the powdered metal body 36a ejected from the molding die 30. The powder metal body (36a in FIG. 4 or permanent magnet 12 and ferromagnetic layer 18 in FIG. 1) was about 12.8 millimeters diameter by about 5.5 millimeters thick with an integrated density of about 5.8 g/cc.

Referring to FIG. 1, the top surface 20 of the ferromagnetic layer 18 was lightly sanded so as to fully expose the copper conductor 26 within the embedded leads 14. This is not necessary, although it ensures intimate contact with the subsequently connected integrated circuit element at the bonding region 16.

Now referring again to FIG. 5, the integrated circuit magnetoresistive sensor 50 was adhesively affixed to the bonding region 16 by conventional semiconductor placement technology. Wire bonds 48 were formed using conventional wire bonding techniques for electrically connecting the magnetoresistive sensor 50 with the exposed copper wires 26. Other electrical connection techniques could also be used, if desired, such as tape automated bonding or flip chip bonding methods. It is to be noted that, although it is not shown in detail, the magnetoresistive sensor 50 generally consists of a group of integrally connected magnetoresistor elements, aligned linearly and connected electrically in series. Illustrative examples of such magnetoresistive structures are disclosed in U.S. Pat. No. 4,926,154 to Heremans et al., U.S. Pat. No. 4,939,456 to Morelli et al., U.S. Pat. No. 4,978,938 to Partin et al. and the above-identified Schroeder patent, all of these patents being assigned to the same assignee of the present patent application.

Several magnetoresistive sensors formed in accordance with the preferred method of this invention were tested. The stationary magnetoresistive sensor was supplied with a constant current, and the voltage across the sensor was detected as a target wheel passed by the sensor, for various widths of the air-gap between the sensor and the target wheel. The target wheel consisted of a succession of steel teeth and slots. The results are listed below in Table I.

TABLE I

| Sensor Dimensions and Measured Sensitivity | | | |
|---|---|---|---|
| Sensor Dimensions: | Sensor 1 | Sensor 2 | Sensor 3 |
| Magnet Diameter (mm) | 12.8 | 12.8 | 12.8 |
| Magnet Thickness (mm) | 5.0 | 4.8 | 5.0 |
| Iron Layer Thickness (mm) | 0.2 | none | 0.4 |
| *Magnetoresistor zero-field resistance (Ohms) | 959 | 1138 | 928 |
| Sensitivity (% of output voltage) | | | |
| 0.5 mm air-gap | 44.7 | 34.7 | 42.7 |
| 1.0 mm air-gap | 23.5 | 19.8 | 22.6 |

*Magnetoresistor zero-field resistance is defined to be the resistance when there is no applied field.

As shown in Table I, the inclusion of the ferromagnetic layer in sensors 1 and 3 improved the sensitivity of the sensor, as compared to sensor 2 which did not include the ferromagnetic layer. Overall, the sensitivities of the magnetoresistive sensors formed in accordance with the preferred method of this invention are qualitatively similar to those obtained with other conventional assembly methods.

In addition, although the powder compaction method described above is preferred for formation of the powder metal body 36a, other methods could also be employed. For example, as shown in the exploded view of FIG. 6, to form the subassembly 110, the permanent magnet powder and ferromagnetic powder could be pre-pressed to form symmetrical halves, i.e., 112a, 112b and 118a, 118b, respectively, such as by the method described above. Longitudinal channels 132a and 132b running from the top surfaces 120a and 120b to the bottom surface 124a and 124b of each half would be provided for housing the insulated coated leads 114. Bonding regions 116a and 116b are also so as to represent the predetermined location for the subsequently affixed magnetoresistive sensor. The subassembly 110 would be formed by inserting the leads 114 between the symmetrical halves and consolidating the halves with sufficient heat and pressure to achieve full density of the materials.

Alternatively, if the ratios of binder to magnetic material are appropriately altered, injection molding techniques for formation of the powder metal body could also be foreseeably employed.

Although the teachings of this invention are specifically directed to the assembly of a semiconductor magnetoresistive sensor, the teachings of this invention also provide a broader concept for assembly of a variety of electrical sensors, wherein the leads are substantially embedded within a powder metal core so as to produce a solid assembly. The embedded leads may have a variety of shapes, such as straight, as shown in FIG. 2, or coiled, as shown in FIG. 7, wherein a single conductor wire 26a is coiled (represented by region 54) and insulated with an appropriate coating 28a at the regions where the wire 26a would be embedded within the powder metal body. The coil shown in FIG. 7 has only one turn, but a plurality of turns is possible, or the coils may be a separate planar element attached analogously, as the magnetoresistive element in the specific embodiment described. Also, depending on the particular application, the turn(s) may or may not be embedded within the powder metal body, and may be insulated differently from the rest of the lead or not insulated at all.

The number of conductors may range from one to a plurality, and may have a variety of physical properties such as magnetic or non-magnetic, depending on the desired application. With a three-lead embodiment, it may be useful with a Hall-type sensor.

Essentially, the assembly of the device, regardless of the shape or number of leads employed, would follow directly the preferred method described above for formation of the magnetoresistive sensor. The particular lead shape would first be manufactured, either by winding or fusing, so as to produce straight leads or appropriately coiled leads. All or part of the leads would then be insulated, if applicable. Next, the leads would be inserted within appropriately disposed longitudinal holes within a bottom die, such as described with reference to FIGS. 3 and 4, and the molding die filled with the desired powder metal and appropriately compacted.

Portions of the leads would be disposed within the powder metal body, while also extending outwardly from the body so as to permit conventional electrical attachment, if desired. An integrated circuit element may or may not be attached to the body, depending on the application and shape of the leads used, and whether the leads are exposed for contact to a sensing element, or coiled, and thus internally hidden within the powder metal body. Also, the coils may or may not be embedded within the powder metal body, depending on the particular application. The method of this invention allows the fabrication of a variety of compact sensors with fewer steps and components and, therefore, reduced costs.

Particular examples of such alternative sensors include a search coil, which is mounted in electrical machinery to measure the flux density in the machine air-gap. The search coil would utilize a coiled conductor, as shown in FIG. 7, and could be mounted on the surface of one of the poles of the machine. Currently, search coils are generally only used in experimental set-ups; but, with the preferred assembly method described herein wherein the final product is characterized by ruggedness and relatively low cost, their applications may extend to production machine control, for instance, in such control schemes as "field oriented control" in induction machines. Another potential application is a thermocouple which could be embedded within the metal body to provide an accurate temperature reading inside the device being monitored. Alternatively, a resistance heating conductor could be placed inside of a powder metal body. Solenoids and other similar coil/core structures could be made inexpensively by embedding the coil in enough powdered iron to form the magnetic core. In addition, the method could be applied to inductors and transformers in high frequency power supplies where ferrite powder is employed and core size, cost and efficiency are important design elements. Further, it is believed that a complete electromagnetic assembly could be formed, with a magnet, a coil and an iron core completing the flux loop. Other electromagnetic devices, such as relays or variable-reluctance sensors, could also be formed. Essentially, any body which requires, or may be modified to accept, embedded leads could be formed with the method of this invention.

In summary, specifically, a permanent magnet package which is ready to be assembled to a magnetoresistive semiconductor element by conventional semiconductor placement and attachment means is provided, wherein the semiconductor is attached to exposed portions of embedded conductors on a sensor side of the package. The sensor is compact and manufactured using fewer assembly steps. The features of the sensor are physically integrated within the permanent magnet body. More broadly, any sensor package having at least one embedded lead may be assembled using the method of this invention so as to produce a relatively inexpensive, compact design.

Particularly advantageous features of this invention include the elimination of the requirement that the semiconductor sensing element be separately packaged and then attached (as a package) to the permanent magnet body. Further, the number of assembly steps is reduced significantly, particularly since a single press forming operation is employed for formation of the magnetic body having the embedded electrical leads. In addition, the magnetic body is connected directly to the sensing element, rather than a relatively large and bulky conventional lead frame, thereby enhancing the reliability of the electrical connections. With a thinner semiconductor package, the magnet assembly is in closer proximity to the toothed wheel, thereby increasing the bias flux and the sensor output. Also, the semiconductor sensing element can be electrically connected to the terminal ends of the embedded leads using conventional semiconductor placement and processing techniques, including wire bonding or conductive epoxy technologies, which are highly automated, precise and efficient.

Therefore, while this invention has been described in terms of a preferred embodiment, it is apparent that other forms could easily be adopted by one skilled in the art, such as by modifying the number or shape of the leads employed, or by substituting different processing steps employed, or by forming any of the variety of applications suggested or contemplated. Accordingly, the scope of this invention is to be limited only by the following claims.

The embodiments of the invention in which an exclusive property or privilege is claimed are defined as follows:

1. A powder metal subassembly for supporting and electrically connecting a magnetic field responsive electrical element, said subassembly comprising:
   a compacted powder metal body having opposed end faces;
   said body predominantly being of a high coercivity permanent magnet material, with one of said opposed end faces of said body being formed of a layer of a high permeability soft magnetic material,
   at least one electrically conductive wire having a portion embedded within said powder metal body between said opposed end faces, said wire having one end exposed on and substantially coterminous on said one opposed end face and its other end having a length projecting substantially beyond the other of said opposed end faces;

means on said coterminous end of said wire for making low resistance electrical connection with a magnetic field responsive electrical element, the length of said embedded wire extending beyond said other of said opposed end faces being effective to facilitate external connection to said magnetic field sensitive element; and means for electrically insulating said powder metal body from said embedded at least one electrically conductive wire, effective to make a subassembly that not only exhibits a wave of magnetic flux traveling across said one opposed end face of said body in response to movement of a member to be sensed, but also facilitates support of and electrical connection to a magnetic field sensor element on said one opposed end face.

2. A powder metal subassembly as recited in claim 1 wherein said means for electrically insulating said powder metal body from said embedded at least one electrically conductive wire comprises a coating of electrically insulating material encapsulating the powder forming said body, effective to provide a high electrical resistance through said body everywhere but through said embedded wire and a substantially electrically insulating coating on said one opposed end face surrounding said end of said wire exposed on said one opposed end face of said body.

3. A powder metal subassembly as recited in claim 1 wherein said high coercivity permanent magnet material is primarily neodymium-iron-boron.

4. A powder metal subassembly as recited in claim 3 wherein said layer of high permeability soft magnetic material is a compacted layer of powder metal that is substantially iron.

5. A powder metal subassembly as recited in claim 1 wherein said compacted powder metal body substantially is of high coercivity permanent magnet material and said one opposed end face is substantially iron.

6. A powder metal subassembly as recited in claim 5 wherein said means for electrically insulating said powder metal body from said embedded at least one electrically conductive wire comprises a coating encapsulating the powder forming said body with an electrically insulative material, effective to provide a high electrical resistance through said body everywhere but through said embedded wire and a substantially electrically insulating coating on said one opposed end face surrounding said end of said wire exposed on said one opposed end face of said body.

7. A powder metal subassembly as recited in claim 6 wherein said means for electrically insulating said powder metal body from said embedded at least one electrically conductive wire also includes an electrically insulative coating around said embedded portion of said at least one electrically conductive wire.

8. A powder metal subassembly as recited in claim 1 wherein said at least one electrically conductive wire is two or more electrically conductive wires, each of which is electrically insulated from the other.

9. A powder metal subassembly as recited in claim 1 wherein said at least one electrically conductive wire is electrically connected to a semiconductor element.

* * * * *